United States Patent [19]

Radigan et al.

[11] 4,289,574
[45] Sep. 15, 1981

[54] PROCESS FOR PATTERNING METAL CONNECTIONS ON A SEMICONDUCTOR STRUCTURE BY USING AN ALUMINUM OXIDE ETCH RESISTANT LAYER

[75] Inventors: Steven J. Radigan; Robert L. Berry, both of San Jose, Calif.

[73] Assignee: Fairchild Camera & Instrument Corp., Mountain View, Calif.

[21] Appl. No.: 157,996

[22] Filed: Jun. 9, 1980

Related U.S. Application Data

[63] Continuation of Ser. No. 34,782, Apr. 30, 1979, abandoned.

[51] Int. Cl.$^3$ .................... H01L 21/28; C23F 1/02
[52] U.S. Cl. ............................ 156/643; 148/6.3; 156/650; 156/665; 156/667; 427/88; 427/90; 427/126.4; 430/318
[58] Field of Search ................... 427/88, 90, 126.4; 156/643, 648, 650, 665, 667; 148/6.3; 430/318

[56] References Cited

U.S. PATENT DOCUMENTS

| | | | |
|---|---|---|---|
| 4,030,967 | 6/1977 | Ingrey | 156/643 |
| 4,057,460 | 11/1977 | Saxena | 156/643 |
| 4,092,210 | 5/1978 | Hoepfner | 156/643 |
| 4,135,954 | 1/1979 | Chang | 156/643 |
| 4,157,269 | 6/1979 | Ning | 156/643 |

OTHER PUBLICATIONS

Johnson et al., "Etch Stop for Reactive Ion Etching of Polysilicon", IBM TDB 21, No. 2, p. 599, Jul. 1978.
Schaible et al., "Reactive Ion Etching of Aluminum and Aluminum Alloys", IBM TDB, 21, No. 4, Sep. 1978.

Primary Examiner—John D. Smith
Attorney, Agent, or Firm—Paul J. Winters; Theodore S. Park; Michael J. Pollock

[57] ABSTRACT

A process for patterning plasma etchable regions on a semiconductor structure includes the steps of forming a layer of an oxide of aluminum over the surface of the semiconductor structure, forming an overlying layer of plasma etchable material on the layer of oxide, and removing undesired portions of the overlying layer by plasma etching to thereby expose portions of the layer of oxide. In some embodiments of the invention the thereby exposed portions of the layer of oxide are then removed, together with any underlying portions of the first layer, by isotropic etching.

7 Claims, 6 Drawing Figures

PROCESS FOR PATTERNING METAL CONNECTIONS ON A SEMICONDUCTOR STRUCTURE BY USING AN ALUMINUM OXIDE ETCH RESISTANT LAYER

This is a continuation, of application Ser. No. 34,782, filed Apr. 30, 1979 now abandoned.

BACKGROUND OF THE INVENTION

1. Field of the Invention

This invention relates to a method for patterning regions formed on semiconductor structures. In particular the invention relates to a process for plasma etching portions of layers of aluminum on a semiconductor structure using chlorine based plasma.

2. Prior Art

Continuing improvements in semiconductor fabrication technology have caused the dimensions of some integrated circuit structures to be limited by the dimensions of aluminum or other metal lines formed on the surface of the structure to interconnect various portions of the underlying structure. Because the reactions involved are not directional, isotropic etchants, such as chemical etchants, are not suitable for etching through thick metal lines while minimizing the reduction of metal line width. One technique which has been developed to allow more accurate control of dimensions is etching of semiconductor structures with gas plasma reactions. Various processes for plasma etching are now known and have been the subject for several patents. See, e.g., U.S. Pat. No. 3,615,956 entitled "Gas Plasma Vapor Etching Process"; U.S. Pat. No. 3,994,793 entitled "Reactive Ion Etching of Aluminum"; and U.S. Pat. No. 4,057,460 entitled "Plasma Etching Process."

Plasma etching processes have been developed which use chlorine based plasmas to remove aluminum with little or no undercutting of overlying protective materials, for example, photoresist. Unfortunately, after removing the aluminum such plasma processes also will etch any silicon or silicon compound, for example, silicon, silicon nitride or silicon dioxide, beneath the aluminum. Because in commercial processing of large quantities of integrated circuits some or all of the integrated circuits will be etched at least in some areas longer than required to remove the aluminum, and because the rate of removal of material by plasma etching is not necessarily uniform across even the surface of a single circuit being etched, a significant amount of etching of materials underlying the aluminum has been observed. For example, in some areas of an integrated circuit the aluminum will be completely removed in a shorter time, while in other areas a longer time will be required. Consequently in those areas where the aluminum is removed relatively quickly the plasma etching will remove underlying materials. This problem usually is most severe in areas of integrated circuits where metal connections make direct contact to underlying silicon, for example, the emitters of bipolar transistors or the sources or drains of MOS transistors. In these areas of an integrated circuit there are frequently PN junctions close to the surface of the silicon, and even shallow plasma etching of the silicon can expose and/or destroy the PN junction and ruin the function of the device.

It is frequently impractical to ensure that these areas of integrated circuits are always completely covered by unetched material, and therefore protected from the plasma. Accordingly, one object of this invention is to overcome the difficulty of using plasma etching for patterning aluminum layers on semiconductor structures. A further object of this invention is to provide a region of plasma etch resistant material over selected portions of any underlying material, to thereby protect this material from etching by the plasma. A further object of this invention is to permit preservation of regions of lower layers of metal when devices with multiple layers of metal are etched.

SUMMARY OF THE INVENTION

The present invention relates to a process for patterning regions on a semiconductor structure. The invention provides a plasma etch resistant layer of aluminum oxide on a semiconductor structure, which layer protects underlying materials from the plasma. According to one embodiment of the invention a first layer of aluminum is formed over the semiconductor structure, and then a layer of an oxide of aluminum is formed over the surface of the first layer. A second, typically thicker, layer of aluminum is then formed over the layer of oxide, and undesired portions of the second layer of aluminum are removed by plasma etching. In some embodiments of the invention the portions of the layer of oxide not covered by the second layer of aluminum or other protective layers are then removed by an isotropic etchant, as are the thereby exposed portions of the first layer of aluminum.

Typically the step of removing undesired portions of the second layer of aluminum is preceded by the step of forming a protective coating over desired portions of the second layer of aluminum to prevent plasma etching of these portions. In one embodiment this protective coating is photoresist. In yet other embodiments of the invention the first layer of aluminum, and the layer of an oxide of aluminum are formed sufficiently thin that if they are later chemically removed only an insignificant amount of undercutting of any overlying material will occur. These embodiments are particularly useful for protecting underlying materials such as nichrome or silicon nitride from degradation during plasma etching.

The invention allows more accurate dimensional control of aluminum layers formed on integrated circuit structures. It further provides a technique for preventing plasma etching of a first layer of metal or other material, when a second layer of metal or other material is plasma etched.

DETAILED DESCRIPTION

Figure 1:
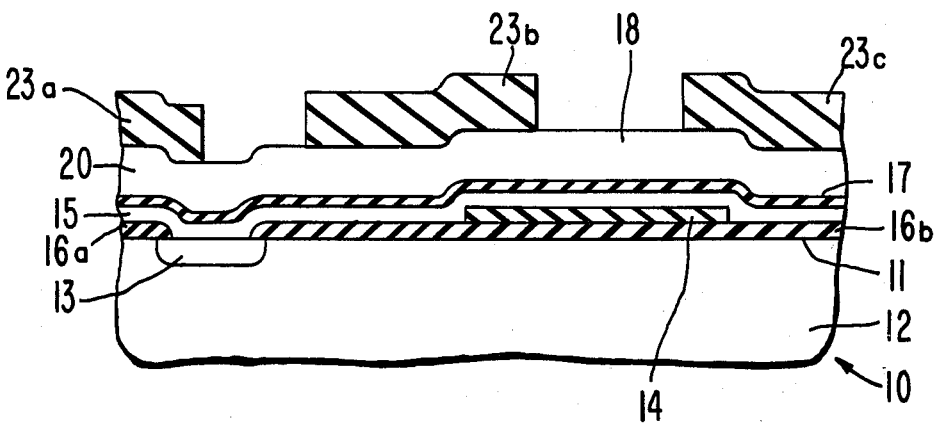
FIG. 1 is a cross-sectional view of a hypothetical semiconductor structure including a PN junction, a layer of nichrome, a thin aluminum layer, a layer of aluminum oxide, a thicker aluminum layer, and a selectively removed layer of photoresist.

FIG. 1 is a cross-sectional view of a semiconductor structure 10. Semiconductor structure 10 includes a substrate 12 in which has been formed a region of impurity 13. Over a portion of surface 11 of substrate 12, a layer of first selected material 16, for example silicon dioxide regions 16a and 16b, has been formed. Over first material 16 a layer of selected material 14 has been formed. Selected material 14 may be silicon nitride, nichrome, or any other material which is desired to be protected from plasma etching. Substrate 12 may be any type of integrated circuit structure, and may include arbitrarily shaped regions of conductive, nonconductive, or semiconductive material previously formed, for example, aluminum, silicon dioxide, silicon, silicon nitride, nichrome, or materials into which impurities have been introduced. The structure 10 depicted in the figures is intended only to illustrate the process of this invention, which is independent of structure 10. In one embodiment of the invention a relatively thin layer of aluminum 15 is formed across the surface of structure 10. Although the invention does not require a relatively thin layer 15 of aluminum a thin layer is advantageous as it may be removed later using an isotropic etchant without significantly undercutting overlying layers.

On the surface of aluminum layer 15 is formed a layer 17 of an oxide of aluminum, typically aluminum oxide ($Al_2O_3$). In the preferred embodiment the first layer of aluminum 15 will be between 200 and 1000 Angstroms thick, while the layer of aluminum oxide 17 will between 40 and 50 Angstroms thick. The thickness of the aluminum oxide is typically self-limiting, that is, only 40-50 Angstroms of oxide 17 will form on layer 15 if the oxide is grown. Of course thicker layers of oxide 17 may be deposited using well known techniques. In one embodiment oxide 17 will be formed in metal depositing equipment simultaneously with, and/or subsequent to, the formation of aluminum layer 15. In other embodiments oxide 17 is formed in ambient air or by a process known in the semiconductor arts as a low temperature oxygen alloying process. This latter process is usually carried out at a temperature of 500° C. or less in an oxidizing ambient such as air or pure oxygen. Following the formation of oxide layer 17 additional aluminum or other material may be deposited to achieve any desired thickness. For example, thicker layers of aluminum 20 may be used to improve the current carrying ability of the metal connections, or for semiconductor structures having a rough surface the thicker aluminum will assist in reliably traversing any rough portions of the surface, for example, the edge of layer 14.

Next, a layer of masking material 23, typically photoresist, is formed across the surface of aluminum 20. Using well-known semiconductor processing technology, masking layer 23 is suitably patterned, for example, to create protective regions 23a, 23b, and 23c over aluminum 20 which is not to be plasma etched.

The purpose of the plasma etching of the combined aluminum structure composed of aluminum 15, aluminum 20 and aluminum oxide 17 is to form metal lines and spacings between metal lines. Plasma etching allows lines and spacings to be formed which have dimensions comparable to or smaller than the thickness of the materials formed on substrate 12. This capability is a result of the anisotropic nature of the plasma etching process.

Figure 2:
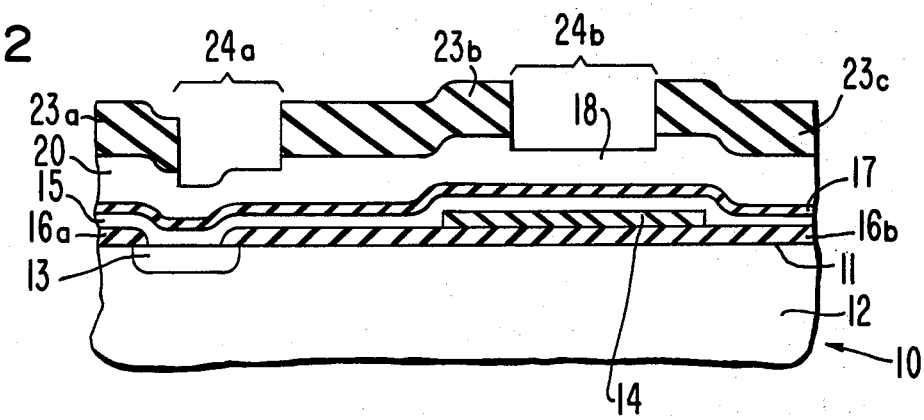
FIG. 2 is a further cross-sectional view showing the appearance of the structure depicted in FIG. 1 after it has been partially etched by a plasma.

The structure shown in FIG. 1 is then plasma etched, typically with a chlorine based plasma. FIG. 2 depicts the appearance of the structure shown in FIG. 1 after the plasma etching process is partially completed. The chlorine plasma does not significantly affect photoresist regions 23a, 23b, or 23c, but etches aluminum 20 in regions 24a and 24b. Because the plasma etching, however, is not necessarily uniform across the surface of structure 10 different amounts of etching will occur at different locations across structure 10. This is schematically represented in FIG. 2 by the different thicknesses of aluminum 20 remaining in region 24a compared with region 24b. If carried out under appropriate conditions the plasma will not significantly etch aluminum oxide 17. For example, using an IPC 5000 plasma reactor, now available from Dionex Co., a power setting of 300 watts, carbon tetrachloride/helium etch gas at 0.300 torr (partial pressure of $CCl_4$ of 0.190 torr) about five minutes are required to remove one micron of aluminum 20 while leaving the aluminum oxide 17.

Figure 3:
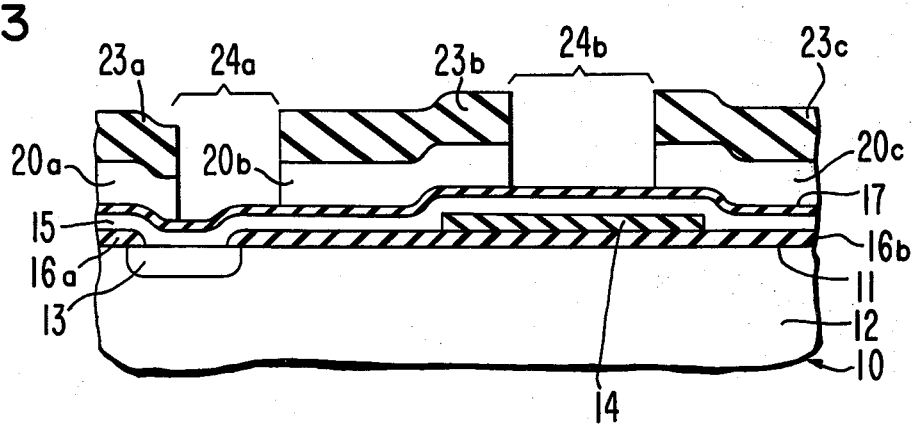
FIG. 3 is a further cross-sectional view showing the appearance of the semiconductor structure after the plasma etching is complete.

As shown in FIG. 3, the plasma will remove aluminum 20 until layer 17 is exposed. Aluminum oxide layer 17 will substantially stop the plasma etching process and allow what might otherwise have been incompletely etched areas, for example, the aluminum in region 24b, to "catch up" with the etching process in other areas of the structure 10. That is, very little or no etching will occur in region 24a while region 24b will continue to be etched. In addition aluminum oxide layer 17 will prevent the plasma from attacking what would otherwise have been exposed silicon at surface 11 of region 13.

Usually further processing will be required to form functional integrated circuits or semiconductor structures. For example, it may be desired to remove mask layer 23 and all of the aluminum 15 and aluminum oxide 17 not covered by the remaining portions of layer 20. This may be accomplished using well-known chemical etching solutions which attack photoresist, aluminum and aluminum oxide. Additionally well-known suitable plasma processing also may be used to remove photoresist 23.

Figure 4:
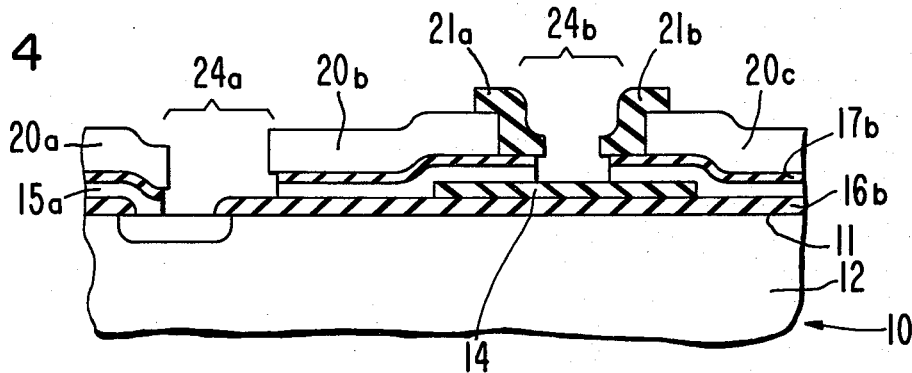
FIG. 4 is a further cross-sectional view showing the appearance of the semiconductor structure after a new masking layer has been formed and after exposed portions of the layer of aluminum oxide and the layer of aluminum have been removed by an isotropic etchant.

As shown in FIG. 4 a layer of protective material 21, typically photoresist, may be formed across the surface of structure 10 where layers 15 and 17 have been exposed by removal of layer 20 but where layers 15 and 17 are to remain. Coating 21 will protect portions of region 24b from attack by the chemical etchants used to remove layers 15 and 17 in region 24b. Note that the isotropic etching of layers 15 and 17 may undercut layers 20 and 21 slightly. This slight undercutting may be minimized by forming thinner layers of aluminum 15 and aluminum oxide 17. Additionally, the extent of the undercutting will also be determined by the resistance of layers 20 and 21 to the etching process used. The structure depicted in either FIG. 3 or FIG. 4 may be processed further using well-known semiconductor fabrication techniques to form additional passive or active components in the surface 16 thereof, or to form additional layers of metal or other materials across the upper surface. For example, the layers of aluminum 15 and 20 may be alloyed to thereby dissolve oxide 17 and create a single layer of aluminum.

Figure 5:
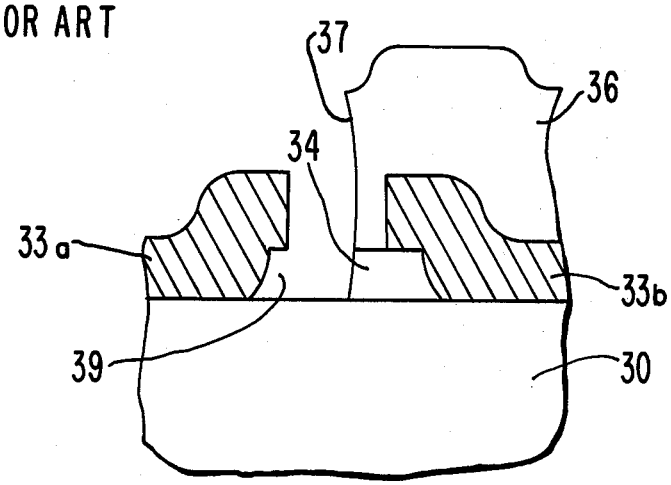
FIG. 5 is a cross-sectional view of a portion of a prior art semiconductor structure having multiple layers of metal connections.

The process of this invention reduces the necessity for critical or careful control of process parameters such as etch rate, etch uniformity, and etch selectivity to obtain consistent reproducible results. A further advantage of the invention may be seen by comparing FIG. 5 and FIG. 6. FIG. 5 is a portion of a typical prior art structure including a semiconductor substrate 30, a first layer of aluminum 34, a second layer of aluminum 36, and a layer of insulating material 33, which has been patterned into two smaller regions of insulating material 33a and 33b. Using prior art wet processes, layer 36 may be etched into the shape shown in FIG. 5. Because layer 36 and layer 34 are the same material, and are both attacked by the wet etchant, both will be removed to create a surface 37 which extends to the surface of substrate 30.

Figure 6:
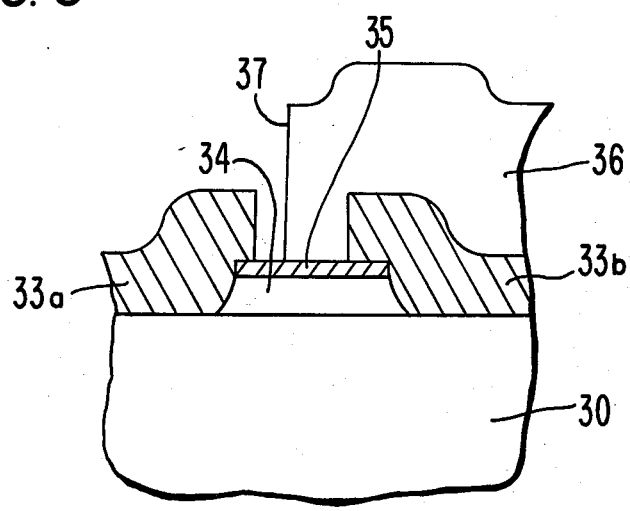
FIG. 6 is a similar cross-sectional view of a semiconductor structure showing the different structure which may be achieved using this invention.

FIG. 6 shows a structure corresponding to that shown in FIG. 5, but in which undesired portions of only aluminum 36 and not aluminum 34 have been removed using one embodiment of the process of this invention. In the structure shown in FIG. 6 a layer of aluminum oxide 35 has been formed across the surface of the first layer of aluminum 34. Thus when the structure is plasma etched only undesired portions of layer 36 are removed, leaving layer 34 intact. As shown in FIG. 6, the invention eliminates the opening 39 beneath layer 33a. Openings such as opening 39 frequently trap contaminating materials adjacent to the surface of substrate 30. Such contaminants may damage or destroy the function of passive or active components formed in substrate 30 beneath opening 39.

A further advantage of the structure shown in FIG. 6 which is achievable using the process of this invention is an increase in allowable alignment tolerances for vias. Vias are used to connect the first and second layers of metal. In prior art structures the vias typically would be formed entirely within the boundaries of the second layer. Otherwise the first layer could be etched completely through creating an open circuit. (For example, in FIG. 5 layer 34 might be completely removed.) In contrast a via formed using the technique shown in FIG. 6 may overlap the second layer of metal because the first layer is not etched.

What is claimed is:

1. A process for protecting selected portions of a semiconductor structure from a plasma etching process, the process for protecting comprising:
    depositing a layer of aluminum over at least the selected portions of the semiconductor structure;
    forming a layer of aluminum oxide over at least those portions of the layer of aluminum overlying the selected portions, the layer of aluminum oxide being plasma etchable at a selected power level; and
    plasma etching the semiconductor structure at a power level less than the selected power level to thereby remove material from the semiconductor structure except where the layer of aluminum oxide protects the underlying semiconductor structure by substantially stopping the plasma etching process.

2. A process for patterning aluminum layers on a semiconductor structure comprising:
    depositing a first relatively thin layer of aluminum on the semiconductor structure;
    creating a layer of an oxide of aluminum on the first layer of aluminum, the layer of an oxide of aluminum being plasma etchable at a selected power level;
    depositing a second relatively thicker layer of aluminum on the layer of an oxide of aluminum;
    removing undesired portions of the second layer of aluminum by plasma etching the second layer of aluminum at a power level less than the selected power level, the plasma etching process being effectively stopped by the layer of an oxide of aluminum; and
    removing at least part of the thereby exposed layer of an oxide of aluminum and the first relatively thin layer of aluminum by an isotropic process to thereby expose regions of the underlying semiconductor structure.

3. A process as in claim 2 wherein the step of removing undesired portions of the second layer of aluminum is preceded by a step of forming a coating resistant to plasma etching over all but the undesired portions of the second layer of aluminum.

4. A process as in claim 3 wherein the coating is photoresist.

5. A process as in claim 2 wherein the oxide of aluminum is aluminum oxide ($Al_2O_3$).

6. A process as in claim 5 wherein the aluminum oxide is formed by heating the layer of aluminum to a temperature of 500° C. or less in an atmosphere containing oxygen.

7. A process as in claim 5 wherein the plasma etching is accomplished using an etch gas containing chlorine.

* * * * *